(12) United States Patent
Ito et al.

(10) Patent No.: US 10,804,221 B2
(45) Date of Patent: Oct. 13, 2020

(54) SUBSTRATE TREATMENT APPARATUS, METHOD OF MANUFACTURING SEMICONDUCTOR DEVICE AND WORKPIECE SUBSTRATE

(71) Applicant: TOSHIBA MEMORY CORPORATION, Minato-ku (JP)

(72) Inventors: Fuyuma Ito, Yokkaichi (JP); Yasuhito Yoshimizu, Yokkaichi (JP); Hakuba Kitagawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/288,896

(22) Filed: Feb. 28, 2019

(65) Prior Publication Data
US 2020/0091092 A1    Mar. 19, 2020

(30) Foreign Application Priority Data

Sep. 14, 2018 (JP) .................................. 2018-172284

(51) Int. Cl.
| | | |
|---|---|---|
| H01L 23/00 | (2006.01) | |
| H01L 21/67 | (2006.01) | |
| H01J 37/32 | (2006.01) | |

(52) U.S. Cl.
CPC ...... *H01L 23/564* (2013.01); *H01J 37/32715* (2013.01); *H01L 21/67069* (2013.01); *H01L 21/67259* (2013.01); *H01L 21/67288* (2013.01); *H01J 2237/3387* (2013.01)

(58) Field of Classification Search
CPC ............. H01L 23/564; H01L 21/67069; H01L 21/67288; H01L 21/67259; H01J 37/32715; H01J 2237/3387
See application file for complete search history.

(56) References Cited

U.S. PATENT DOCUMENTS

| | | | |
|---|---|---|---|
| 6,613,608 | B1 | 9/2003 | Yamaguchi et al. |
| 8,801,891 | B2 | 8/2014 | Tsuruda |
| 2012/0301832 | A1* | 11/2012 | Tsuruda ................. B32B 38/10 |
| | | | 430/322 |
| 2017/0133328 | A1* | 5/2017 | Ranish ............. H01L 21/67103 |
| 2017/0221776 | A1* | 8/2017 | Lacroix ................... H01L 22/12 |
| 2018/0265989 | A1 | 9/2018 | Yoshimizu et al. |
| 2018/0269082 | A1 | 9/2018 | Yoshimizu et al. |

FOREIGN PATENT DOCUMENTS

| | | |
|---|---|---|
| JP | 9-129528 A | 5/1997 |
| JP | 9-148427 A | 6/1997 |
| JP | 2000-114556 A | 4/2000 |
| JP | 2001-110477 A | 4/2001 |
| JP | 2008-53595 A | 3/2008 |
| JP | 5642628 B2 | 12/2014 |
| JP | 2019-54227 A | 4/2019 |

* cited by examiner

*Primary Examiner* — Syed I Gheyas
(74) *Attorney, Agent, or Firm* — Oblon, McClelland, Maier & Neustadt, L.L.P.

(57) ABSTRACT

In one embodiment, a substrate treatment apparatus includes a substrate holder configured to hold a substrate provided with a film. The apparatus further includes a film treatment module configured to treat the film in accordance with warpage of the substrate such that the film includes a first region having a first film quality or a first film thickness and a second region having a second film quality or a second film thickness different from the first film quality or the first film thickness.

20 Claims, 4 Drawing Sheets

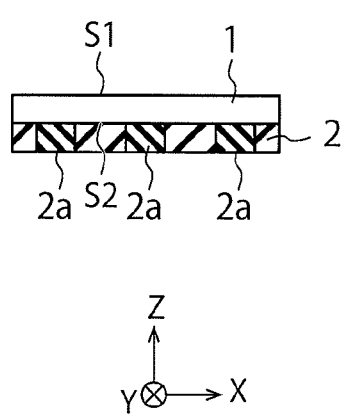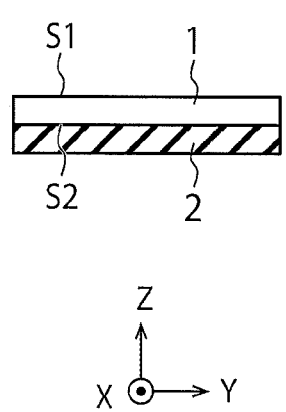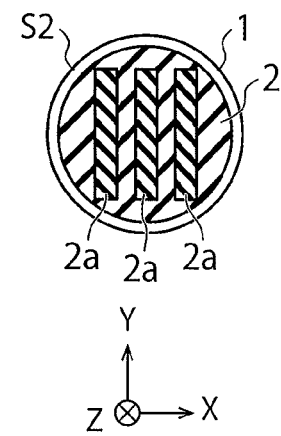
FIG. 4A  FIG. 4B  FIG. 4C
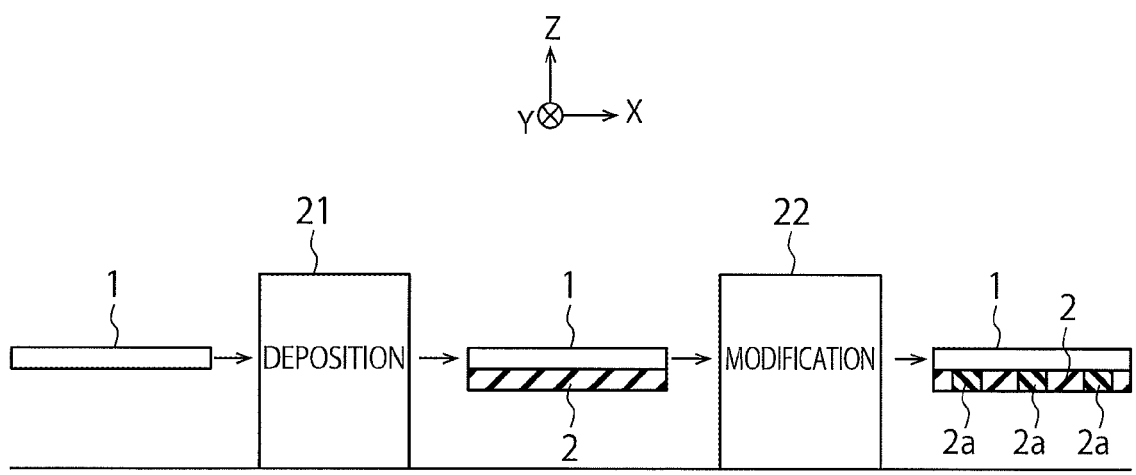
FIG. 5

SUBSTRATE TREATMENT APPARATUS, METHOD OF MANUFACTURING SEMICONDUCTOR DEVICE AND WORKPIECE SUBSTRATE

CROSS REFERENCE TO RELATED APPLICATION

This application is based upon and claims the benefit of priority from the prior Japanese Patent Application No. 2018-172284, filed on Sep. 14, 2018, the entire contents of which are incorporated herein by reference.

FIELD

Embodiments described herein relate to a substrate treatment apparatus, a method of manufacturing a semiconductor device and a workpiece substrate.

BACKGROUND

A film formed on a surface of a wafer may inhibit warpage of the wafer.

BRIEF DESCRIPTION OF THE DRAWINGS

FIGS. 2A to 4C are diagrams for explaining a wafer treatment method of the first embodiment;

FIG. 5 is a cross-sectional view schematically showing a configuration of a semiconductor manufacturing system of the first embodiment;

DETAILED DESCRIPTION

Figure 1:
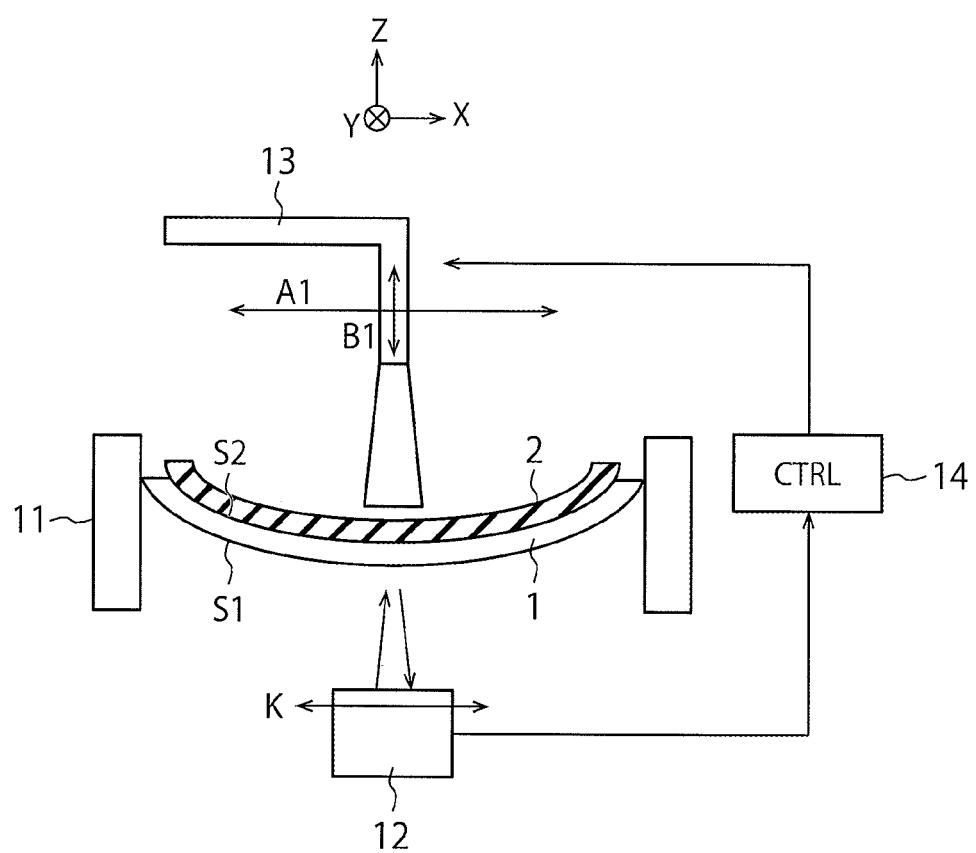
FIG. 1 is a cross-sectional view schematically showing a configuration of a substrate treatment apparatus of a first embodiment.

In one embodiment, a substrate treatment apparatus includes a substrate holder configured to hold a substrate provided with a film. The apparatus further includes a film treatment module configured to treat the film in accordance with warpage of the substrate such that the film includes a first region having a first film quality or a first film thickness and a second region having a second film quality or a second film thickness different from the first film quality or the first film thickness.

Embodiments will now be explained with reference to the accompanying drawings. In FIGS. 1 to 7, the identical or similar configuration is denoted by the same reference numeral, and an overlapping explanation thereof is omitted.

First Embodiment

FIG. 1 is a cross-sectional view schematically showing a configuration of a substrate treatment apparatus of a first embodiment. The substrate treatment apparatus in FIG. 1 is a plasma treatment apparatus that treats a film 2 provided on a wafer 1 by using plasma.

The wafer 1 is a semiconductor wafer such as a silicon wafer, for example. The wafer 1 is an example of a substrate. The wafer 1 has a first surface S1 on which a device is formed or is to be formed, and a second surface S2 on which the film 2 for inhibiting warpage of the wafer 1 is formed. Here, the device includes, for example, a discrete semiconductor device such as a transistor, or an integrated circuit. The film 2 is a silicon film, a silicon oxide film, a silicon nitride film, or a metal film, for example. The film 2 may be formed on the wafer 1 for the purpose of inhibiting the warpage, or may be formed on the wafer 1 for other purposes.

FIG. 1 shows an X direction and a Y direction which are substantially parallel to the center region of the first surface S1 and the second surface S2 of the wafer 1 and are perpendicular to each other, and shows a Z direction which is substantially perpendicular to the center region of the first surface S1 and the second surface S2 of the wafer 1. Herein, a +Z direction is regarded as an upward direction, and a −Z direction is regarded as a downward direction. The −Z direction may match the gravity direction, or may not match the gravity direction. The Y direction is an example of a first direction, and the X direction is an example of a second direction.

The substrate treatment apparatus in FIG. 1 includes a wafer holder 11, a warpage measurement instrument 12, a plasma irradiator 13 and a controller 14. The wafer holder 11 is an example of a substrate holder. The plasma irradiator 13 and the controller 14 is an example of a film treatment module.

The wafer holder 11 holds the wafer 1 on which the film 2 is provided. For example, the wafer holder 11 holds a bevel of the wafer 1. The bevel of the wafer 1 is an example of an edge of a substrate. The film 2 of the present embodiment is formed on the wafer 1 before the wafer 1 is held by the wafer holder 11. However, the film 2 may be formed on the wafer 1 in a state where the wafer 1 is held by the wafer holder 11.

The warpage measurement instrument 12 measures, in a non-contact manner, warpage of the wafer 1 held by the wafer holder 11. The warpage measurement instrument 12 includes a light source that irradiates the first surface S1 side of the wafer 1 with light, and a detector that detects the light reflected by the first surface S1 side of the wafer 1. The warpage measurement instrument 12 measures the warpage of the wafer 1 on the basis of the detection result of the light by the detector. The warpage measurement instrument 12 outputs the measurement result of the warpage of the wafer 1 to the controller 14.

An arrow K indicates that, while irradiating the wafer 1 with light, the warpage measurement instrument 12 moves in the horizontal direction so as to scan the wafer 1 with the light. Accordingly, various points on the wafer 1 are irradiated with the light so that the warpage of the wafer 1 can be measured. For example, the edge of the wafer 1 is scanned with the light by 360 degrees so that the warpage of the wafer 1 can be efficiently measured.

The warpage measurement instrument 12 may measure the warpage of the wafer 1 held by the wafer holder 11 by another technique. For example, the warpage measurement instrument 12 may be a position sensor provided on a wafer chuck portion of the wafer holder 11. In this case, the warpage of the wafer 1 is measured by the position sensor, and the measurement result of the warpage of the wafer 1 is outputted from the position sensor to the controller 14.

The plasma irradiator 13 irradiates the film 2 with plasma. Accordingly, stress applied to the wafer 1 from the film 2 is changed so that the warpage of the wafer 1 can be changed. The plasma irradiator 13 of the present embodiment irradiates the film 2 with plasma under normal temperature and normal pressure. FIG. 1 shows a plasma irradiation nozzle constituting the plasma irradiator 13.

The controller 14 controls various operations of the substrate treatment apparatus in FIG. 1. Examples of the controller 14 include a processor, an electric circuit, and a PC (personal computer). For example, the controller 14 controls the operation of the wafer holder 11, the measurement which is performed by the warpage measurement instrument 12, the plasma irradiation which is performed by the plasma irradiator 13, and the like.

The controller 14 controls the plasma irradiation of the film 2 by the plasma irradiator 13 in accordance with the measurement result of the warpage of the wafer 1 outputted from the warpage measurement instrument 12. Accordingly, the film 2 can be treated such that the warpage of the wafer 1 is inhibited. In the present embodiment, the film 2 is partially modified (reformed) with plasma, whereby the warpage of the wafer 1 is inhibited. An example of modification of the film 2 is oxidation or nitridation of a part of the film 2 through plasma irradiation. Other examples of modification of the film 2 include partially reducing or increasing the thickness of the film 2 by plasma irradiation.

Under control by the controller 14, the plasma irradiator 13 irradiates the film 2 with plasma and scans the film 2 with the plasma, thereby partially modifies the film 2. An arrow A1 indicates that the plasma irradiation nozzle horizontally moves during the irradiation so that the film 2 is scanned with the plasma. An arrow B1 indicates that the plasma irradiation nozzle vertically moves during the plasma irradiation, so that the density or area of the plasma irradiation is modulated. The controller 14 determines a plasma irradiation position or a plasma irradiation condition in accordance with the measurement result of the warpage of the wafer 1, and controls the plasma irradiation in accordance with the determined irradiation position or the determined irradiation condition. As a result, the film 2 is partially modified. Which part of the film 2 is modified is described later in detail.

The wafer 1 is commonly conveyed with the first surface S1 directed upward. In contrast, the wafer 1 in FIG. 1 is held by the wafer holder 11 with the first surface S1 directed downward. Therefore, the substrate treatment apparatus in FIG. 1 may include an inversion unit that inverts the direction of the first surface S1 of the wafer 1. In this case, the direction of the first surface S1 of the wafer 1 is inverted from the upward direction to the downward direction before the wafer 1 is mounted on the wafer holder 11, and the first surface S1 of the wafer 1 is inverted from the downward direction to the upward direction after the wafer 1 is detached from the wafer holder 11.

The film 2 of the present embodiment is formed on the wafer 1 outside the substrate treatment apparatus in FIG. 1. However, the film 2 may be formed on the wafer 1 inside the substrate treatment apparatus in FIG. 1. For example, the film 2 may be formed on the wafer 1 with plasma from the plasma irradiator 13 after the wafer 1 is mounted on the wafer holder 11. The film 2 formed on the wafer 1 may be etched or removed inside the substrate treatment apparatus in FIG. 1.

FIGS. 2A to 4C are diagrams for explaining a wafer treatment method of the first embodiment. Note that, unlike FIG. 1, each of FIGS. 2A to 4C illustrates that the first surface S1 of the wafer 1 is directed upward, and the second surface S2 of the wafer 1 is directed downward.

Figure 2A:
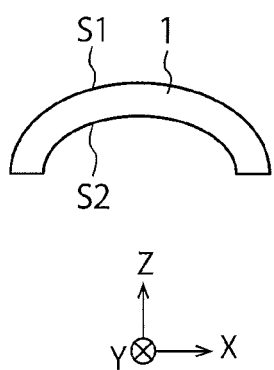
Figure 2B:
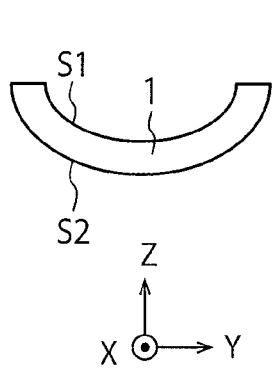
Figure 2C:
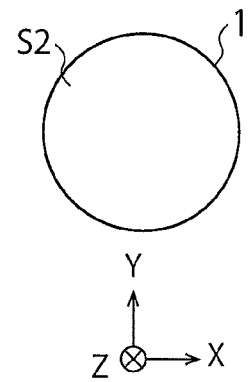

FIGS. 2A, 2B and 2C respectively show an XZ cross section, a YZ cross section and the second surface S2 of the wafer 1 before formation of the film 2 on the second surface S2 of the wafer 1. However, another film (not illustrated) is already formed on the first surface S1 or/and the second surface S2 of the wafer 1. As a result, the wafer 1 is warped into an upwardly projected shape along the X direction (FIG. 2A), and is warped into a downwardly projected shape along the Y direction (FIG. 2B).

Figure 3A:
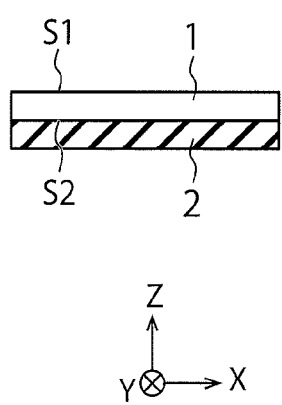
Figure 3B:
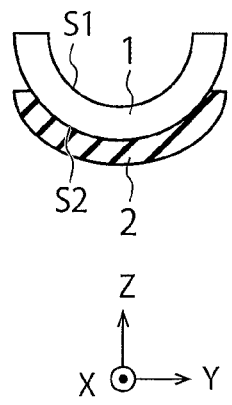
Figure 3C:
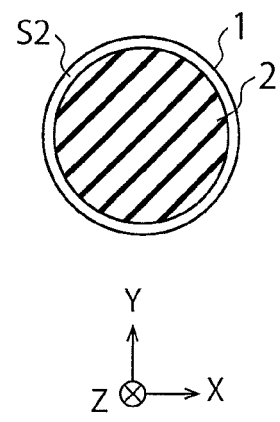

FIGS. 3A, 3B and 3C respectively show the XZ cross section, the YZ cross section and the second surface S2 of the wafer 1 after formation of the film 2 on the wafer 1 but before modification of the film 2. The film 2 of the present embodiment isotropically applies compressive stress to the wafer 1. Consequently, the compressive stress is applied to the wafer 1 in the X direction and the Y direction. Since the compressive stress is applied to the wafer 1 so as to widen the second surface S2, the film 2 inhibits the upwardly projected warpage (FIG. 3A), but the film 2 increases the downwardly projected warpage (FIG. 3B).

FIGS. 4A, 4B and 4C respectively show the XZ cross section, the YZ cross section and the second surface S2 of the wafer 1 after formation of the film 2 on the wafer 1 and after modification of the film 2. In the present embodiment, regions 2a of the film 2 are irradiated with plasma so that the film 2 is partially modified within the regions 2a. Hereinafter, the regions 2a are referred to as "modified regions 2a". The modified regions 2a of the present embodiment are modified so as to apply tensile stress to the wafer 1. Since the modified regions 2a of the present embodiment are processed so as to each have a band-like shape extending in the Y direction, the modified regions 2a apply, to the wafer 1, tensile stress mainly in the Y direction. The tensile stress is applied to the wafer 1 so as to contract the second surface S2 mainly in the Y direction. Accordingly, while the upwardly projected warpage is inhibited by the film 2 (FIG. 4A), the downwardly projected warpage is also inhibited by the film 2 (FIG. 4B).

As described above, according to the present embodiment, the warpage of the wafer 1 in the X direction and the warpage of the wafer 1 in the Y direction can be independently inhibited by partial modification of the film 2. Therefore, even in a case where the wafer 1 is warped into a complicated shape, such as a case where the wafer 1 is warped into an upwardly projected shape along the X direction, and is warped into a downwardly projected shape along the Y direction, the warpage of the wafer 1 can be sufficiently inhibited. The warpage of the wafer 1 may cause problems such as an error in conveyance of the wafer 1, contact between the wafers 1, contact between the wafer 1 and the substrate treatment apparatus, misalignment relative to the wafer 1 in lithography, abnormal discharge in the substrate treatment apparatus, and the like. However, according to the present embodiment, these problems can be reduced.

In FIGS. 4A to 4C, the film 2 is modified with plasma so as to have the modified regions 2a each having a band-like shape extending in the Y direction and the remaining regions having not been modified with the plasma and having shapes surrounding the modified regions 2a. When the film 2 is modified by oxidation or nitriding, each of the former regions (modified regions 2a) is an example of the first region having a first film quality, and each of the latter regions (remaining regions) is an example of the second region having a second film quality. The modified regions 2a of the film 2 apply, to the wafer 1, tensile stress mainly in the Y direction such that the wafer 1 is inhibited from being warped into a downwardly projected shape mainly along the Y direction. In contrast, the remaining regions of the film 2 apply, to the wafer 1, compressive stress in the X direction and the like such that the wafer 1 is inhibited from being warped into an upwardly projected shape along the X direction and the like. Each of the modified regions 2a is sandwiched between portions of the remaining regions.

Modification of the film 2 may be implemented by partial reduction or partial increase of the thickness of the film 2. In this case, the thickness of each of the modified regions 2a is reduced by partial reduction of the thickness of the film 2, or is increased by partial increase of the thickness of the film 2. In this case, each of the modified regions 2a is an example of the first region having a first film thickness, and each of the remaining regions is an example of a second region having a second film thickness. The partial reduction of the film 2 is implemented by partially etching of the film 2, for example. The partial increase of the thickness of the film 2 is implemented by partial deposition of a new film on the film 2, for example.

In the present embodiment, the film 2 is scanned with plasma in the Y direction, so that the modified regions 2a each having a band-like shape extending in the Y direction are formed. The modified regions 2a may be formed by preparation of a mask including band-like openings extending in the Y direction, and by supply of plasma to the film 2 via the mask. Alternatively, the modified regions 2a may be formed by use of a technique other than plasma irradiation, as described later.

In irradiation of the film 2 with plasma, the plasma irradiation position or the plasma irradiation condition can be determined in accordance with the shape of the warpage of the wafer 1, for example. Examples of the plasma irradiation position include the coordinates or lengths of the modified regions 2a. Examples of the plasma irradiation condition include a plasma irradiation time, a plasma power (W), a plasma frequency (Hz), and the type, flow rate, and components of gas for generating plasma. For example, when the downward warpage is large, the length of each of the modified regions 2a may be increased or the intensity of the plasma may be increased, such that tensile stress to the modified regions 2a is increased. Accordingly, the warpage of the wafer 1 can be efficiently inhibited.

Measurement of the warpage of the wafer 1 may be carried out only before the plasma irradiation, or may be additionally carried out during the plasma irradiation. In the former case, measurement of the warpage of the wafer 1 may be carried out by the warpage measurement instrument 12 after the wafer 1 is mounted on the wafer holder 11, as shown in FIG. 1, or may be carried out by another warpage measurement instrument before the wafer 1 is mounted on the wafer holder 11. For example, a warpage measurement instrument external to the substrate treatment apparatus may measure the warpage of the wafer 1, and may provide the measurement result to the controller 14. On the other hand, in the latter case, the controller 14 may change the plasma irradiation position or the plasma irradiation condition, as needed, on the basis of the temporal change in the warpage of the wafer 1.

Examples of the modification of the film 2 include oxidizing the film 2, nitriding the film 2, and making the film 2 porous. For example, the film 2 which is a silicon oxide film may be partially nitrided, the film 2 which is a silicon nitride film may be partially oxidized, the film 2 which is a silicon film may be partially oxidized, nitrided, or made porous, or the film 2 which is a metal film may be partially oxidized. However, the modification method of the film 2 is not limited to these examples. For example, the film 2 may be partially removed by plasma irradiation, or the thickness of the film 2 may be increased.

The shape of each of the modified regions 2a may be a shape other than the aforementioned shape. Also, the film 2 may further have a modified region having a film quality different from those of the modified regions 2a. A specific example of the film 2 in this case is described later.

FIG. 5 is a cross-sectional view schematically showing a configuration of a semiconductor manufacturing system of the first embodiment.

FIG. 5 shows a deposition apparatus 21 that deposits (forms) the film 2 on the wafer 1, and a modification apparatus 22 that partially modifies the film 2. The substrate treatment apparatus in FIG. 1 corresponds to one example of the modification apparatus 22. Formation and modification of the film 2 of the present embodiment are accordingly carried out in different apparatuses, but may be carried out in the same apparatus.

In the present system, the warpage of the wafer 1 is inhibited by the film 2 formed for the purpose of inhibiting the warpage of the wafer 1. However, the warpage of the wafer 1 may be inhibited by the film 2 formed for another purpose. For example, the films 2 may be formed on the first surface S1 and the second surface S2 of the wafer 1 for the purpose of forming a device on the first surface S1 of the wafer 1, and the film 2 formed on the second surface S2 may be reused in order to inhibit the warpage of the wafer 1.

Figure 6:
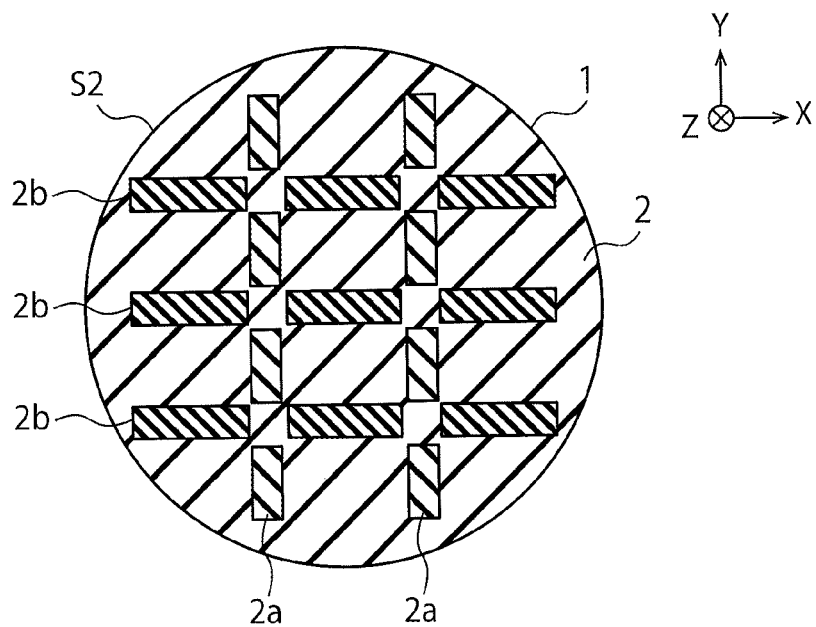
FIG. 6 is a diagram for explaining a wafer treatment method of a modification of the first embodiment.

FIG. 6 is a diagram for explaining a wafer treatment method of a modification of the first embodiment.

The film 2 of the present modification has the modified regions 2a having been modified with plasma and each having a band-like shape extending in the Y direction, modified regions 2b having been modified with plasma and each having a band-like shape extending in the X direction, and the remaining regions having shapes surrounding the modified regions 2a, 2b. Each of the modified regions 2a, 2b is sandwiched between portions of the remaining regions.

The film 2 of the present modification having not been modified is a neutral film, and applies no stress to the wafer 1. On the other hand, the modified regions 2a of the present modification are modified so as to apply tensile stress to the wafer 1. Since the modified regions 2a of the present modification are processed so as to each have a band-like shape extending in the Y direction, the modified regions 2a apply, to the wafer 1, tensile stress in the Y direction. Furthermore, the modified regions 2b of the present modification are modified so as to apply compressive stress to the wafer 1. Since the modified regions 2b of the present modification are processed so as to each have a band-like shape extending in the X direction, the modified regions 2b apply, to the wafer 1, compressive stress mainly in the X direction.

As a result, the modified regions 2a apply, to the wafer 1, tensile stress mainly in the Y direction such that the wafer 1 is inhibited from being warped into a downwardly projected shape mainly along the Y direction. The modified regions 2b apply, to the wafer 1, compressive stress in the X direction such that the wafer 1 is inhibited from being warped into an upwardly projected shape along the X direction. Consequently, also in the present modification, the warpage shown in FIGS. 4A to 4C can be inhibited. Each of the former regions (modified regions 2a) is an example of the first region having the first film quality. Each of the latter regions (modified regions 2b) is an example of the second region having the second film quality.

In a case where the film 2 of the present modification is modified by the substrate treatment apparatus in FIG. 1, first plasma irradiation of forming the modified regions 2a of the film 2 is carried out, and then, second plasma irradiation of forming the modified regions 2b of the film 2 is carried out, for example. However, the order of carrying out the first plasma irradiation and the second plasma irradiation may be changed.

As described above, in the present embodiment, the film 2 provided on the wafer 1 is partially modified, whereby the warpage of the wafer 1 is inhibited. Therefore, according to the present embodiment, for example, appropriate stress is applied to the wafer 1 from the film 2, whereby the warpage of the wafer 1 can be appropriately inhibited.

Second Embodiment

Figure 7:
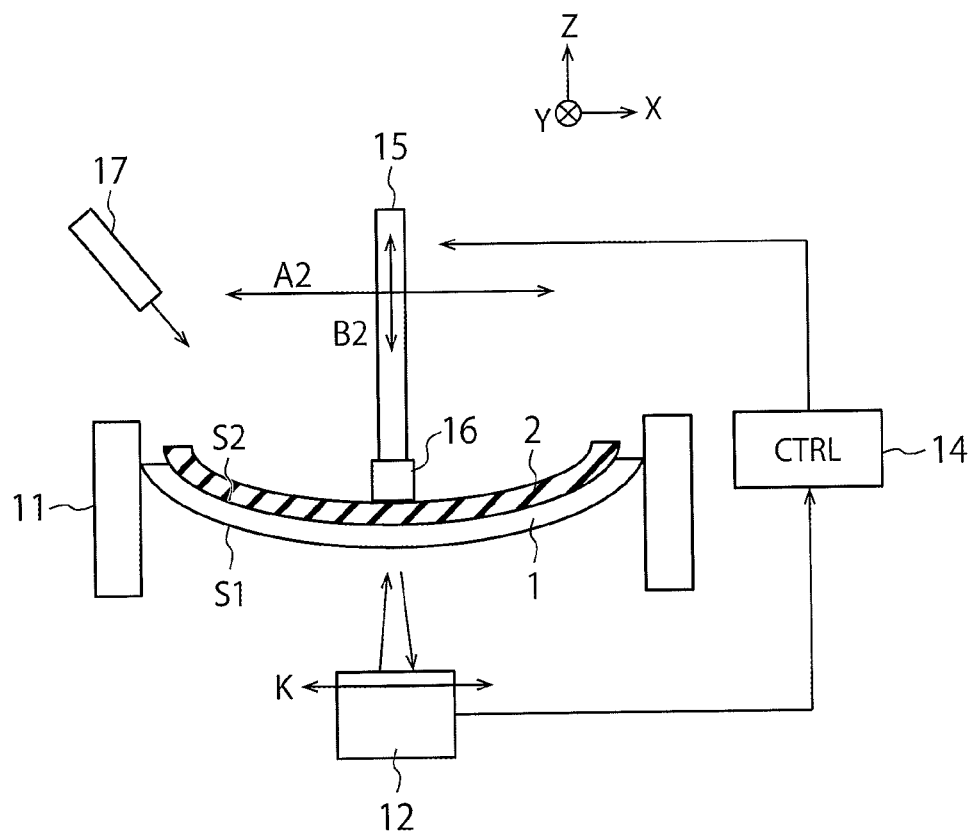
FIG. 7 is a cross-sectional view schematically showing a configuration of a substrate treatment apparatus of a second embodiment.

FIG. 7 is a cross-sectional view schematically showing a configuration of a substrate treatment apparatus of a second embodiment.

A substrate treatment apparatus in FIG. 7 includes a metal member holder 15 that holds a metal member 16, in place of the plasma irradiator 13.

The metal member holder 15 brings the metal member 16 formed of predetermined metal into contact with the film 2. Accordingly, the film 2 can be partially modified, and stress being applied to the wafer 1 from the film 2 can be changed. Specifically, the film 2 in contact with the metal member 16 is partially modified. As a result, the warpage of the wafer 1 can be changed, as in the first embodiment. The film 2 in the present embodiment is, for example, an amorphous silicon film. Examples of the metal member 16 include a noble metal member formed of noble metal. FIG. 7 shows a metal member holding arm constituting the metal member holder 15.

The controller 14 controls operation of the metal member holder 15 in accordance with the measurement result of the warpage of the wafer 1 outputted from the warpage measurement instrument 12. Under control by the controller 14, the metal member holder 15 brings the metal member 16 into contact with the film 2, and scans the film 2 by means of the metal member 16, thereby partially modifies the film 2. An arrow A2 indicates that the metal member holding arm horizontally moves the metal member 16 in contact with the film 2 so that the film 2 is scanned by means of the metal member 16. An arrow B2 indicates that the metal member holding arm vertically moves the metal member 16 so as to bring the metal member 16 into contact with the film 2 or separate the metal member 16 from the film 2. As in the plasma irradiation, the controller 14 determines the contact position and the contact condition of the metal member 16 in accordance with the measurement result of the warpage of the wafer 1, and controls the operation of the metal member holder 15 in accordance with the determined contact position and the determined contact condition. As a result, the film 2 is partially modified. Examples of the contact position include the coordinates or the lengths of the modified regions. Examples of the contact conditions include the movement speed of the metal member 16.

The shapes and the like of the modified regions are similar to those of the modified regions 2a, 2b of the first embodiment. According to the present embodiment, the warpage can be appropriately inhibited, as in the first embodiment, by modification of the film 2 with use of the metal member 16.

Examples of the modification of the present embodiment include making the film 2 porous. Modification of the film 2 with use of the metal member 16 is carried out in gas or in liquid, for example. The substrate treatment apparatus in FIG. 7 includes a nozzle 17 for supplying this gas or this liquid to the film 2. The operation of the nozzle 17 is controlled by the controller 14. The nozzle 17 is an example of a supplier.

While certain embodiments have been described, these embodiments have been presented by way of example only, and are not intended to limit the scope of the inventions. Indeed, the novel apparatuses, methods and substrates described herein may be embodied in a variety of other forms; furthermore, various omissions, substitutions and changes in the form of the apparatuses, methods and substrates described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
a substrate holder configured to hold a substrate provided with a film; and
a film treatment module configured to treat the film in accordance with warpage of the substrate such that the film includes a first region having a first film quality or a first film thickness and a second region having a second film quality or a second film thickness different from the first film quality or the first film thickness,
wherein the film treatment module treats the film such that the first region applies, to the substrate, one of compressive stress and tensile stress in a first direction, and the second region applies, to the substrate, the other of the compressive stress and the tensile stress in at least a second direction different from the first direction.

2. The apparatus of claim 1, further comprising a warpage measurement instrument configured to measure the warpage of the substrate,
wherein the film treatment module treats the film in accordance with the warpage of the substrate measured by the warpage measurement instrument.

3. The apparatus of claim 2, wherein the warpage measurement instrument measures the warpage of the substrate by irradiating the substrate with light and detecting the light reflected by the substrate.

4. The apparatus of claim 2, wherein the warpage measurement instrument is a position sensor provided on the substrate holder.

5. The apparatus of claim 1, wherein the film treatment module includes a plasma irradiator configured to irradiate the film with plasma.

6. The apparatus of claim 1, wherein the film treatment module includes a metal member configured to come into contact with the film.

7. The apparatus of claim 6, further comprising a supplier configured to supply gas or liquid to the film.

8. A method of manufacturing a semiconductor device, comprising:
preparing a substrate having a first face on which a device is formed,
forming a film on an opposite face of the first face of the substrate; and
performing a first process that partially modifies the film,
wherein the first process includes treating the film in accordance with warpage of the substrate such that the film includes a first region having a first film quality or a first film thickness and a second region having a second film quality or a second film thickness different from the first film quality or the first film thickness, and
wherein the first process includes treating the film such that the first region applies, to the substrate, one of compressive stress and tensile stress in a first direction, and the second region applies, to the substrate, the other of the compressive stress and the tensile stress in at least a second direction different from the first direction.

9. The method of claim 8, further comprising performing a second process that partially modifies the film under a condition that is different from a condition of the first process.

10. The method of claim 9, the first process and the second process are performed in a first direction and in a second direction different from the first direction in a plane of the substrate, respectively.

11. The method of claim 8, further comprising measuring the warpage of the substrate,
wherein the first process is performed in accordance with the measured warpage of the substrate.

12. The method of claim 8, wherein the first process comprises partially oxidizing the film, partially nitriding the film, partially making the film porous, or partially increasing or reducing a film thickness of the film.

13. The method of claim 8, wherein the first process comprises irradiating the film with plasma.

14. The method of claim 8, wherein the first process comprises contacting a metal member with the film.

15. A workpiece substrate comprising:
a substrate having a first face on which a device is formed; and
a film provided on an opposite face of the first face of the substrate and including a first region and a second region that surrounds or sandwiches at least a portion of the first region,
wherein a film quality or a film thickness of the film in the first region is different from a film quality or a film thickness of the film in the second region, and
wherein the film in the first region has a structure that is partially made porous.

16. The workpiece substrate of claim 15, wherein the film further includes a third region having a film quality or a film thickness that is different from the film quality or the film thickness of the first region and the film quality or the film thickness of the second region.

17. The workpiece substrate of claim 16, wherein the first region and the third region extend in a first direction and in a second direction different from the first direction in a plane of the substrate, respectively.

18. The workpiece substrate of claim 15, wherein the film includes silicon.

19. The workpiece substrate of claim 16, wherein the second region further surrounds or sandwiches at least a portion of the third region.

20. The workpiece substrate of claim 17, wherein
the first region includes a plurality of first portions provided on a plurality of first lines that extend in the first direction, and
the third region includes a plurality of second portions provided on a plurality of second lines that extend in the second direction.

* * * * *